United States Patent [19]

Schramm

[11] Patent Number: 4,622,917
[45] Date of Patent: Nov. 18, 1986

[54] APPARATUS AND METHOD FOR ELECTROLESS PLATING

[75] Inventor: Charles H. Schramm, Fort Lee, N.J.

[73] Assignee: ETD Technology, Inc., Shoreview, Minn.

[21] Appl. No.: 692,880

[22] Filed: Jan. 18, 1985

Related U.S. Application Data

[63] Continuation of Ser. No. 423,821, Sep. 27, 1982, abandoned.

[51] Int. Cl.$^4$ .............................................. H05K 3/42
[52] U.S. Cl. .................................... 118/696; 118/315; 118/316; 118/423; 118/428; 118/603; 118/612; 118/699; 427/97
[58] Field of Search ............... 118/603, 612, 315, 316, 118/423, 428, 696, 699; 204/275

[56] References Cited

U.S. PATENT DOCUMENTS

| | | | |
|---|---|---|---|
| 3,158,500 | 11/1964 | Sallo | 427/438 |
| 3,895,137 | 7/1975 | Avramidis | 427/295 |
| 4,143,618 | 3/1979 | Vecchio | 118/429 |
| 4,174,261 | 11/1979 | Pellegrino | 204/273 |
| 4,262,044 | 4/1981 | Kuczma | 118/429 |
| 4,478,882 | 10/1984 | Scorta | 427/97 |

Primary Examiner—John D. Smith
Attorney, Agent, or Firm—Merchant, Gould, Smith, Edell, Welter, Schmidt

[57] ABSTRACT

An apparatus and method for the electroless plating of articles. A tank is provided for sequentially containing the respective constituent baths corresponding to the steps of the electroless plating process. An article to be plated, such as a printed circuit board, is supported in the center of the tank immersed in the constituent bath contained therein. A pair of inwardly facing parallel manifolds are disposed at opposite ends of the tank. The constituent solution is pumped through a nozzle matrix in the inward facing wall of a first manifold onto the article and is simultaneously sucked away from the opposing side of the article through the matrix of the nozzles defined in the inward facing wall of a second manifold. The direction of pumping is alternated for periodically reversing the direction of suction and impingement. The alternating pressure difference created across the surface of the article being plated substantially improves the rate of metal deposition over prior art systems and allows for a uniform and high quality plate over the entire surface of the article. Additionally, through-holes defined in the article are thoroughly and uniformly deposited with electroless metal.

19 Claims, 5 Drawing Figures

APPARATUS AND METHOD FOR ELECTROLESS PLATING

This is a continuation of application Ser. No. 423,821 filed Sept. 27, 1982, now abandoned.

BACKGROUND OF THE INVENTION

Electroless plating is a proces that is well-known in the art for chemically depositing metal on metallic or non-metallic substrates. The electroless plating of copper is of considerable commercial importance in the electronics industry, particularly in the fabrication of printed circuitry used in electronic equipment. In fabricating printed circuitry, a thin layer of copper must first be deposited by electroless plating onto a non-conductive surface such as plastic, to make the surface electrically conductive. This thin conductive surface serves as an electrically conductive flash layer receptive to further deposition of metal by electro-deposition, which is used to build up a plate to a desired thickness for an actual conductive circuit pattern.

The typical prior art electroless plating process generally comprises the steps of treating the surface of the article to be plated by immersing the article in a bath containing a stannous salt; catalyzing the article by immersing it in solution for providing catalytic nucleating centers on the surface of the article; and treating the catalyzed surface of the article by immersing it in an electroless solution including a salt of the metal and a reducing agent. The steps of the electroless plating process typically are performed in a tank that is filled with a static bath corresponding to the desired step of the electroless plating process. The article to be plated, such as a printed circuit board substrate, is immersed in the static bath until the desired treatment is completed.

In the prior art, the process steps are performed sequentially by draining the tank and refilling it with the constituent bath of each succeeding step until the entire process is completed. Alternatively, the process may be performed by maintaining a series of tanks and sequentially immersing the article to be plated in each tank containing the appropriate bath.

There are several serious drawbacks to using the above-described prior art static systems of electroless deposition. First, static systems are characteristically slow. For example, it can take longer than a day to plate a single printed circuit board substrate with only one mil of copper by electroless deposition where static baths are used. This seriously inhibits the volume production of plated articles, such as is demanded in the commercial manufacture of printed circuit boards.

Second, the chemical constituents in electroless plating baths are continuously being consumed. Thus, these baths are in a constant state of change. It is extremely difficult to control the chemical stability of a constituent bath to maintain a relatively high plating rate over long plating periods as required when prior art systems are employed. Consequently, the static baths tend to become unstable and decompose with use. Therefore, chemical stability, which is important in order to maintain a relatively high plating rate for the duration of the plating process, is lost.

Third, with respect to the plating of through-holes, the quality and speed of electroless plating of tiny through-holes in printed circuit boards is severely limited by prior art electroless deposition systems. Typically, in printed circuit board fabrication, electroless metal is deposited as a uniform surface coating or in a predetermined pattern on a nonconductive substrate. The substrate is generally copper-clad plastic laminate, having a copper foil laminated to one or both substrate surfaces. In double-sided printed circuit boards, and in multilayered printed circuit board packages, connections are provided between conductive surfaces by means of through-holes drilled in the laminate. The walls of the through holes are made conductive with an electroless coating. Such holes, because of their minute size, can be very difficult to access with the constituent baths of the electroless process using a system of immersion in a static baths. Consequently non-uniform or incomplete electroless plating of through-holes may result. This significantly reduces the quality of the printed circuit board produced, and increases the number of boards that ultimately must be rejected.

Also, in prior art systems hydrogen gas produced during the plating process may accumulate in the through-holes, as well as in tiny pits and pores in the printed circuit board surface, which further interferes with the electroless plating process. Additionally, because of the resulting amount of included hydrogen in electroless metal deposits, the plate may exhibit poor ductility, and therefore easily can be fractured in later use by vibration or bending.

Accordingly, it is a primary object of the present invention to provide a new and novel method and apparatus for electrolessly plating articles which substantially increases the reaction rates of the constituent electroless plating baths, and that deposits a given thickness of metal onto a substrate in a fraction of the time required in prior art systems.

Another object of the present invention is to provide a method and apparatus for electroless plating that provides complete and uniform plating of apertures in the articles to be plated, such as in printed circuit board through-holes.

It is an additional object of the present invention to provide a method and apparatus for electroless plating that results in a uniform and ductile metallic layer on the entire surface of the article, such as on both side of double sided printed circuit boards.

SUMMARY OF THE INVENTION

An apparatus and method for electroless plating articles is described. A tank is provided for containing the respective constituent baths corresponding to the steps of the electroless plating process. A pair of inwardly facing manifolds are disposed at opposite sides of the tank. The inward facing surface of each manifold has a matrix of closely spaced holes defined therethrough which serve as individual nozzles. A bracket centrally disposed within the tank is provided for supporting an article to be plated, such as a printed circuit board, between the manifolds. A pair of oppositely directed pumps are connected independently to each manifold through inlet and outlet ports provided in the base of each manifold. An automatic switching unit is provided for enabling the pumps to be switched on and off alternately such that one pump is on-line at a time operating in a direction opposite to that of the other pump.

During operation of the apparatus, the article is immersed in the constituent bath which fills the tank. The constituent bath is pumped into the one manifold and is forced under pressure through the nozzles to impinge onto the article to be plated. Simultaneously, the same pump withdraws fluid from the other manifold, sucking the constituent bath away from the opposing side of the article to be plated. The other pump is then placed on-line and the flow direction is reversed such that suction and impingement of fluid occurs in the opposite direction with respect to the article being plated. Also, the article itself is oscillated back and forth in a direction substantially perpendicular to the direction of suction and impingement.

By creating a pressure difference across the article being plated while its immersed in the constituent bath corresponding to each step in the electroless plating process, a considerable increase in the rate of metal deposition on the surface of the article over prior art systems is realized. Further, the stability of the constituent chemical baths is maintained, and uniformity of the thickness and quality of metal deposition onto the article surface is achieved. In articles having numerous apertures (in particular, printed circuit boards which may have thousands of holes through their surface), a uniform and continuous deposit results on the entire surface of each hole wall. A high quality deposit is accomplished because the pressure difference created across the holes insures that they are fully accessed with each chemical constituent bath used in the electroless plating process.

Regardless of the prior art method of electroless deposition that may be employed, by using the inventive apparatus to create a pressure difference in the electroless solution and other constituent solutions with respect to the article being plated, a substantial increase in the plating rate and in the quality of metal deposition can be accomplished.

Other objects and many attendant advantages of the invention will become more apparent upon a reading of the following description together with the drawings in which like reference numerals refer to like parts throughout and in which:

DETAILED DESCRIPTION OF THE DRAWINGS

Figure 1:
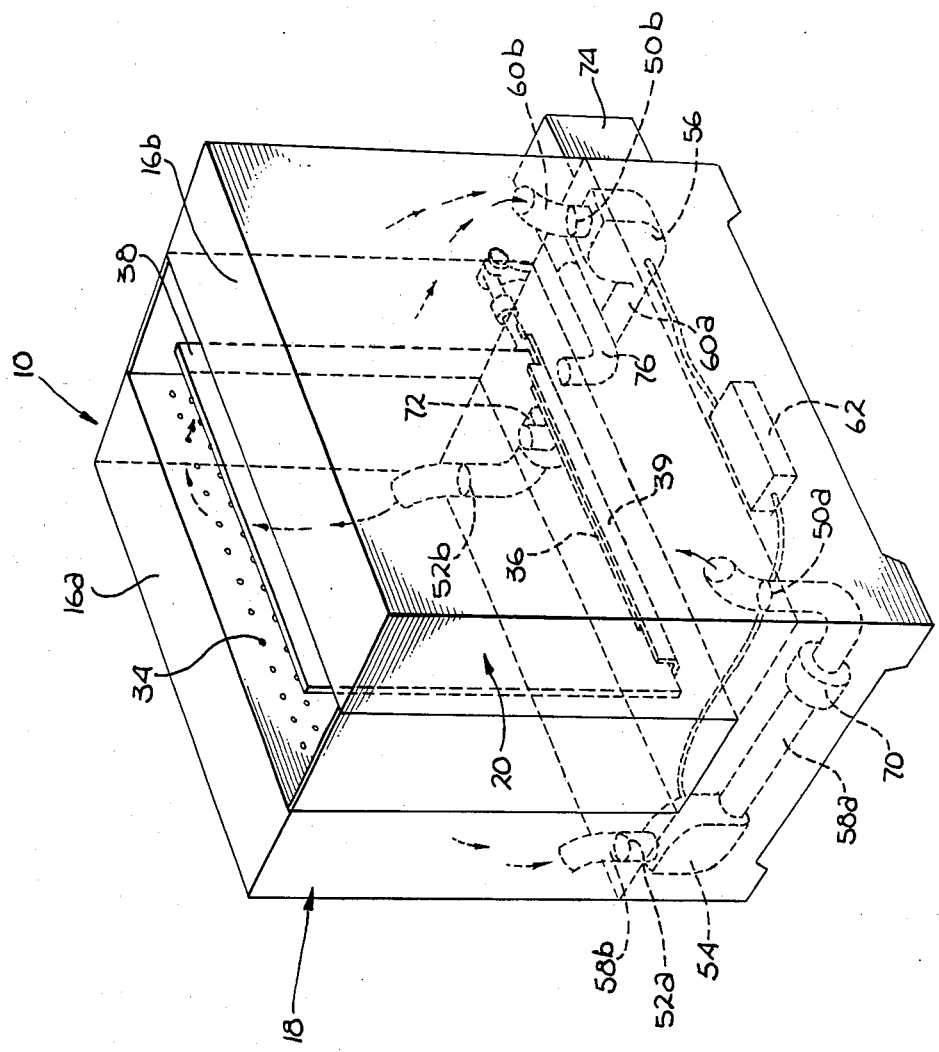
FIG. 1 is a perspective view of an electroless plating apparatus showing the pumps, interconnecting pipe and associated equipment which are incorporated in the present invention.

Referring generally to FIG. 1, a perspective view of the preferred embodiment of the present invention is shown. This embodiment is comprised of a rectangular tank 10 having a pair of rectangular manifolds 18 and 20 disposed at opposite sides thereof. As more clearly illustrated in FIG. 4, which is a top sectional view taken along line 4—4, the sides and base of the tank 10, respectively, also form the ends 12a and 12b, sides 14a, 14b, 15a, and 15b, and bases 16a and 16b of the manifolds. The entire apparatus is composed of plastic, such as polyvinyl chloride, but other suitable materials may alternatively be used.

Figure 2:
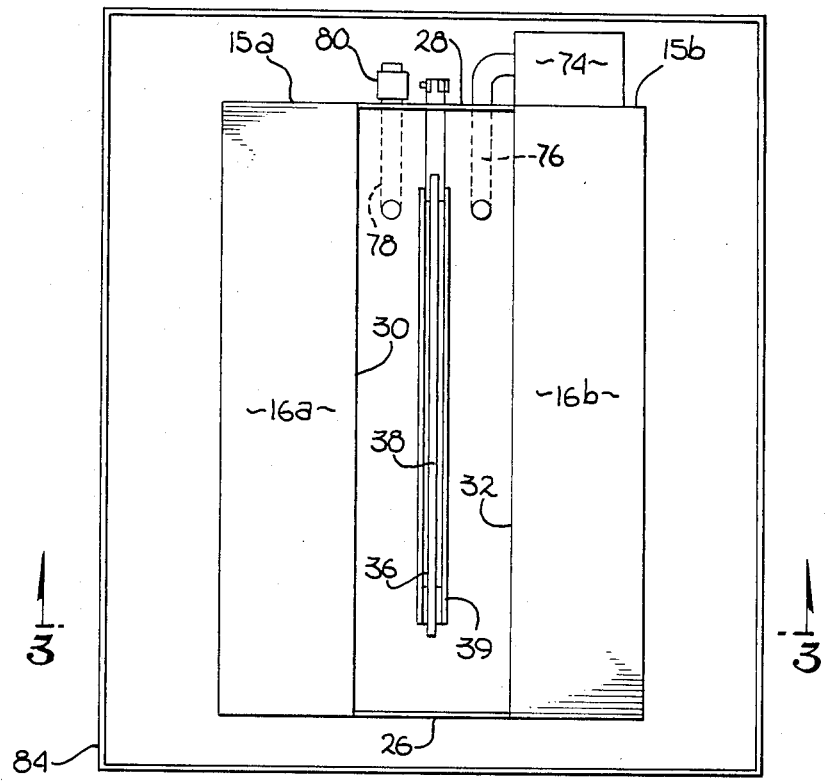
FIG. 2 is a top view of the entire apparatus shown immersed in a larger independent tank into which constituent baths of the process are contained and into which the entire apparatus is immersed.

Referring to FIG. 2, on the inward facing walls 30 and 32 of the manifolds 18 and 20, respectively, are a plurality of nozzles 34. The nozzle arrangement of the presently preferred embodiment comprises a pair of matrices 35 and 37, most clearly shown in FIGS. 3 and 5 each having approximately 7000.02" diameter holes evenly spaced apart along the surface of the inward facing wall 30 and 32 of each manifold. While in the preferred embodiment, the nozzle arrangement is particularly suited for electroless plating of printed circuit boards and other substantially flat objects, it should be appreciated that the nozzles and manifolds may be alternatively arranged to provide complete coverage for objects of more complicated geometries or of threedimensional objects.

Figure 4:
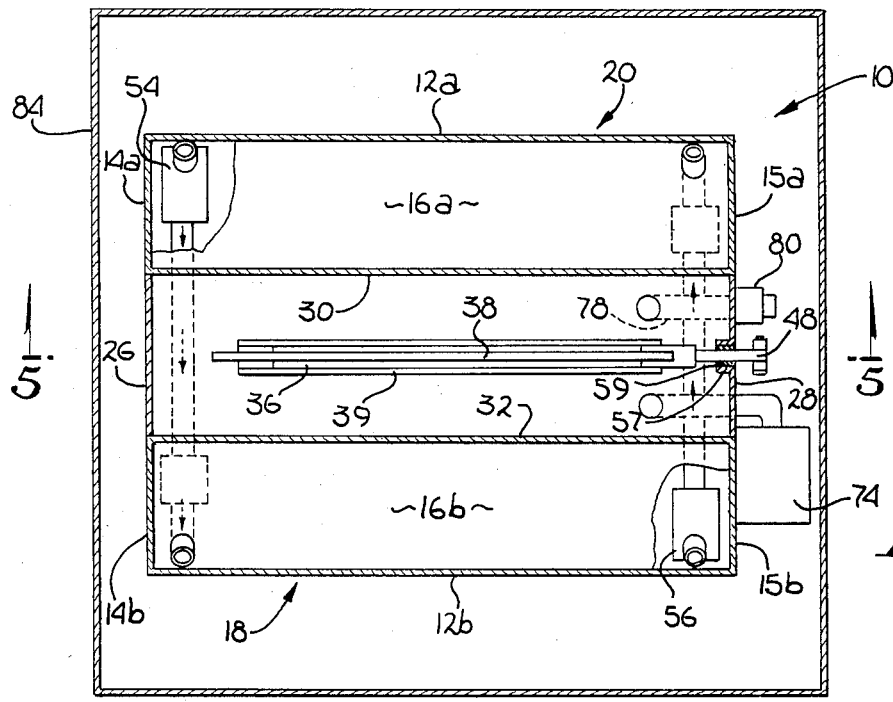
FIG. 4 is a top view of the apparatus taken along line 4—4 of FIG. 3 illustrating detail of the pumping arrangement, piping, and drain connections.

Still referring to FIG. 4, the storage volume of the tank 10 is defined by the inward facing walls 30 and 32 of the manifolds and the tank side portions 26 and 28. The article to be plated is disposed centrally within the tank, and is immersed to a desired level in the constituent bath which fills the tank, as will be described later in greater detail.

Figure 5:
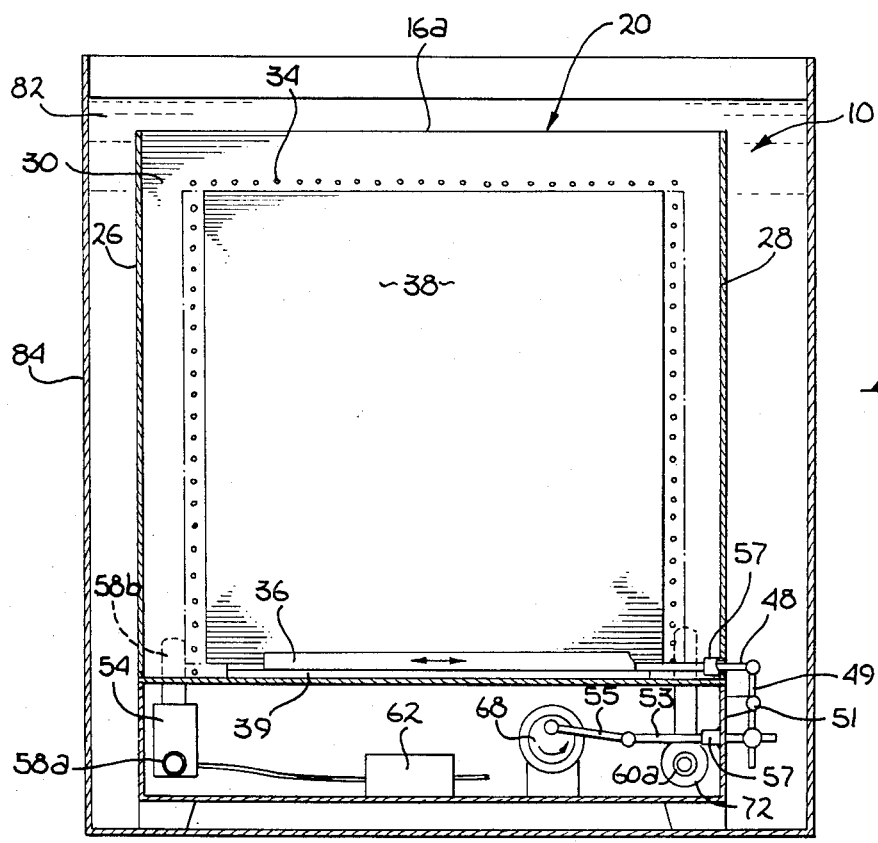
FIG. 5 is a sectional view taken along line 5—5 of FIG. 4 showing the rocker arm mechanism used for oscillating the article in the preferred embodiment of the present invention.

Referring generally to FIG. 1, and as further shown in FIG. 5, in the presently preferred embodiment, a bracket 36 is provided to support the printed circuit board 38 or other flat article in a position substantially perpendicular to the tank base and parallel to the inward facing walls 30 and 32 of the manifolds. The bracket is slideable in a track 39 centrally mounted to the tank base so that the printed circuit board 38 can be oscillated in a back-forth motion perpendicular to the direction of flow of constituent bath through the nozzle matrices 35 and 37. As best shown in FIG. 5, oscillation of the bracket is accomplished by a motor driven rocker arm mechanism, the drive link 48 of which is connected to one end of the sliding bracket 36, as will later be described in further detail.

Referring once again to FIG. 1, the base of each manifold is provided with a pair of ports 50a and 50b and 52a and 52b respectively, disposed at opposite ends of each manifold. The pumps 54 and 56 deliver and withdraw fluid through the ports in each manifold through discharge lines 58a and 60a and suction lines 58b and 60b. The discharge and inlet lines protrude through the manifold ports and are directed away from the nozzles to prevent unwanted turbulence near the nozzles which could interfere with fluid flow therethrough. Each manifold is otherwise completely closed on all sides, so that fluid may be pumped under pressure into the tank 10 or sucked out of the tank through the nozzles 34. Two pumps are provided and are operated alternately to allow for periodic reversal of flow direction. The pumps are, therefore, arranged to operate in opposite directions, with only one pump operating at a time. The discharge lines 58a and 60a and suction lines 58b and 60b may optionally be provided with check valves as necessary to prevent recirculation of fluid through a non-operative pump while the other pump is in operation.

Although in the pump arrangement just described each pump is connected to independent lines which are connected to the holes in the floor of each manifold, it should be appreciated that the present invention is not limited to this arrangement, and that a variety of pump arrangements well known in the art could serve equally as well.

The pumps 54 and 56 are connected to an automatic switching unit 62 which alternately turns on and shuts off each pump. This switching unit may be provided with an adjustable timer so that the frequency at which the pumps are switched on and off may be controlled within some preselected time interval.

Having described the primary structural features of the present invention, the operation of the apparatus and the inventive process will now be described, and particular features of the invention will be described in greater detail.

First, a printed circuit board 38 or other object to be plated is mounted onto the sliding bracket 36 as shown in FIG. 1. The tank 10 is then filled with the constituent bath of the particular process step to be performed. During the filling process, the pumps 54 and 56 may be turned on to insure that the pump lines and manifolds become completely filled with fluid entering through the nozzle matrices 35 and 37.

Figure 3:
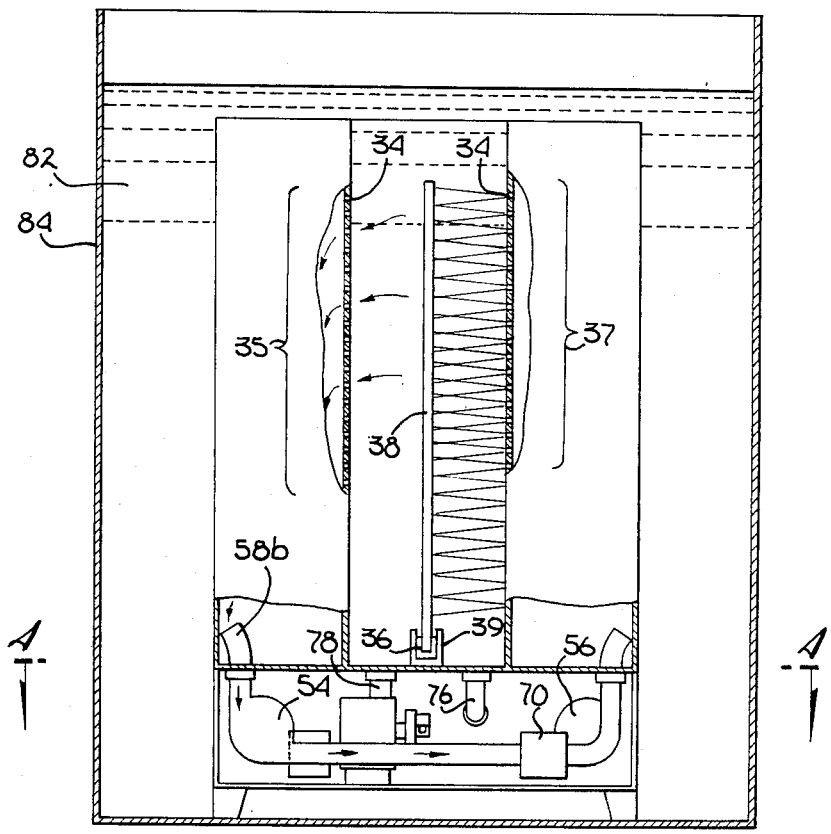
FIG. 3 is a sectional view of the apparatus taken along line 3—3 of FIG. 2 that shows the apparatus immersed in an independent tank operating on an article with fluid following in a single direction.

During operation of the apparatus, as illustrated in FIG. 3, the constituent bath is pumped through the first pump 54 into the first manifold 18, such that it is discharged through the nozzles 34 of matrix 37 at high pressure. Since each hole in the nozzle matrix operates as an individual nozzle, a high velocity stream of fluid impinges onto a corresponding local area of the printed circuit board 38 or other article being plated. Simultaneously, fluid is sucked through the nozzle matrix 35 of the second manifold 20 away from corresponding local areas of the printed circuit board 38. The solution is then drawn through the suction inlet line 58b of the first pump 54, and is discharged through discharge line 58a back into the first manifold 18. The constituent bath is thereby continuously recirculated through the electroless plating apparatus.

The combined action of the fluid impinging under pressure against one side of the board and of being sucked away from the opposite side of the board results in a continuous flow of the bath through the numerous through-holes in the printed circuit board being plated. This cooperating impingement-suction action of the constituent bath, which operates on the printed circuit board surfaces and through the through-holes, contributes substantially to the quality and plating rate of electroless metal deposited on through-hole walls and on the surfaces of the printed circuit board. It is also contributes to the chemical stability of the constituent bath. Further, the continuous throughput of the constituent bath ensures complete immersion and contact with areas of the board that are often starved of the bath in prior art systems. Additionally, hydrogen bubbles which accumulate in through-holes or in pits and pores of the board are eliminated as a result of the suction and impingement action created in the apparatus.

The foregoing describes the operation of the apparatus with the constituent bath flowing in one direction. In the preferred embodiment of the present invention, the direction of flow is reversed at preselected intervals. By periodically reversing flow direction, the constituent bath alternately impinges on opposite sides of the article. Flow reversal helps to insure that a uniform electroless deposit is achieved over surfaces of the article. A time interval of between five and thirty seconds is presently employed for this purpose.

Additionally, the article itself is oscillated back and forth at right angles to the impinging fluid streams. This oscillation is necessary because some articles, in particular, printed circuit boards, may have more than 20,000 holes distributed randomly over their surface. Many of the holes may not line up with any of the individual nozzles in the nozzle matrix. By oscillating the board, all holes may directly be impinged by a stream of fluid. Further, oscillation insures that the plate is uniform over flat surfaces, i.e., that a raised "image" of the matrix of impinging fluid streams does not result on the article.

As shown in FIG. 5, oscillation of the article is accomplished in the preferred embodiment by a motorized rocker arm mechanism. A drive link 48 links the sliding bracket 36 to rocker arm 49 through guide 57. Rocker arm 49 pivots about pivot 51 upon each rotation of a motor driven disk 68 via push rod 53 and connecting rod 55. Each rotation of the disc 68 thus causes a back and forth translational motion of the bracket 36 in track 39. The article 38 mounted on the bracket 36, is thereby oscillated back and forth.

In line filters 70 and 72, mounted in the pump interconnecting lines, are also provided. These filters remove particulate matter from the bath. Filtration is particularly important because even minute dirt particles will act as nucleating centers for electroless plating solution, causing unwanted precipitation and destabilization of the constituent bath.

It has been found that improved stability of the constituent bath may also be achieved by bubbling air up through the tank 10. Thus, as clearly shown in FIG. 1, in the presently preferred embodiment an air pump 74 is provided to pump air through an air line 76 directly into the tank.

The present invention offers significant advantages over the prior art systems of electroless plating. Such prior art systems typically suspend the object to be plated in static baths. Sometimes the article is agitated mechanically within the bath. Nevertheless, mechanical agitation alone does not appreciably improve the rate of reaction, the stability of the bath, or the uniformity of the electroless plate. Nor does such agitation of printed circuit boards help to access tiny through-holes to ensure that through-hole walls are thoroughly and uniformly plated. Further, in static bath systems, the printed circuit boards may be suspended perpendicular to the floor of the tank, or multiple boards may be supported parallel to one other at various angles from perpendicular through to the horizontal position within the tank solution. When the boards are suspended perpendicularly to the tank floor, plating may be thicker at the lower portion of the board due to downward precipitation of the electroless solution as a result of gravity. Similarly, when boards are stacked at an angle or horizontally, the upper side of the board may be plated with a thicker electroless plate than the bottom side of the board, since the electroless solution will tend to precipitate away from the underside of the board. However, by continuously circulating the solution through the tank, as in the present invention, and by using the suction-impingement arrangement described herein, uniform plating of the entire board, including the walls of through holes, is achieved in a fraction of the time previously required.

In order to obtain optimal results using the inventive apparatus, each step having a given chemical constituent solution used in the electroless plating process should be performed in the electroless plating apparatus of the present invention.

The chemical solutions used in the electroless plating process, and the order in which the object to be plated is bathed in such solutions, are well known in the prior art. It should be appreciated that the order in which these steps are performed may vary somewhat, and the chemical constituents may also vary depending on the particular prior art process that is employed. For a detailed description of prior art electroless plating processes using noble metals, see for example, Shipley, Jr., U.S. Pat. Nos. 3,011,920 issued Dec. 5, 1961, or Grunwald, 3,694,250 issued Sept. 26, 1972.

The following describes one embodiment of the series of steps which is used for the electroless deposition of copper in the present invention. However, the present invention is not limited to depositing copper, and numerous other metals, including nickel, cobalt, palladium, platinum, gold, and silver may also be electrolessly placed. Each step is conducted in the electroless plating apparatus which provides several additional operative steps including moving the constituent bath with respect to the article and creating a pressure difference therein, as earlier described.

The steps of the electroless plating process are performed one by one by draining the tank 10 of one constituent bath and filling it with the constituent bath the succeeding step. It should be appreciated that a drain line 78 having a valve 80 is provided for this purpose. Alternatively, a separate apparatus may be used for each constituent bath used in the process. In this way, for each step of the process, the article can be sequentially placed in the tank of each apparatus containing the respective constituent bath of the process. This avoids the necessity of repeatedly draining and filling a single apparatus to perform each step in the electroless plating process, and a measurable increase in efficiency and production may therefore be achieved.

Additionally, it should also be appreciated that the entire electroless plating apparatus may be immersed into a separate tank 78 which contains a constituent bath 82 of the process, as shown in FIGS. 2-5. Thus, a series of tanks which together contain all the baths used in the process can be continuously maintained. Then, the apparatus supporting the article to be plated can be easily moved from tank to tank to perform the successive process steps.

Turning now to the inventive process, first, the article to be plated is treated with hydrochloric acid. Next, the article may optionally be rinsed with water to remove the excess hydrochloric acid. The article is then activated with a colloidal catalytic solution of stannous chloride and palladium chloride. The palladium chloride is a salt catalytic to the deposition of copper and is used for catalyzing the surface of the article to provide catalytic nucleating centers on the article's surface. Once again, the article may optionally be rinsed with water. Next, the article is treated with an accelerator, which is an organic material having a high molecular weight, such as polyethylene glycol. This substance forms an adhesive-like coating on the article to be plated. The article is then rinsed with water. Finally, the article is placed in a solution that includes copper sulfate, Rochelle salt and formaldehyde. This final step is considered the "deposition" or "plating" step. The copper sulfate, which is a water soluble metal salt, is a source of cupric ions. The Rochelle salt operates as a complexing agent making the cupric ions available as needed to the reducing action of the reducing agent. In the preferred embodiment of the present invention, the complexing agent is EDTA, manufactured by the Dow Chemical Corporation. The formaldehyde operates as a reducing agent to reduce the cupric ions to metallic form.

Optimal improvement in the quality of the electroless deposit, plating rate and stability of constituent baths is realized if the inventive apparatus is used to create the afore-mentioned pressure difference and agitation in each bath used in the electroless plating process. It should be appreciated, however, that improved electroless deposition may be achieved even if the inventive apparatus is used only in connection with the deposition step. To achieve best results, however, it is recommended that the inventive apparatus be used with all constituent baths of the process. Although certain embodiments of the present invention have been disclosed and described in detail herein, it will be understood by those skilled in the art that various changes in form and detail may be made therein without departing from the spirit and scope of the invention.

Having described the inventive apparatus and method, what is claimed is:

1. An electroless plating apparatus comprising:
  (a) a tank in which an article to be electrolessly plated is supported such that said article is at least partially immersed in a constituent bath within said tank; and
  (b) means for creating a pressure difference within said bath, wherein said bath impinges onto a first surface of said article and is sucked away from a second surface of said article opposite said first surface, wherein said means for creating a pressure difference comprises:
    (i) means a first preselected distance away from said first surface for directing said bath toward said first surface; and
    (ii) means a second preselected distance away from said second surface for drawing said bath away from said second surface, whereby said first and second surfaces are thoroughly subjected to said constituent bath.

2. An electroless plating apparatus, comprising:
  (a) a tank in which an article to be electrolessly plated is supported such that said article is at least partially immersed in a constituent bath within said tank; and
  (b) means for creating a pressure difference within said bath whereby said bath impinges onto a first surface of said article and is sucked away from a second surface of said article, wherein said means for creating a pressure difference comprises:
    (i) pumping means for delivering said bath under pressure through a plurality of delivery ports manifolded to said pumping means onto a first surface of said article, said delivery ports being a first preselected distance away from said article and distributed corresponding to the area to be electrolessly plated; and
    (ii) suction means for sucking said bath through a plurality of return ports manifolded to said suction means away from said second surface, said return ports being a second preselected distance away from said article and distributed correspondingly to the area to be electrolessly plated; whereby said bath impinges onto said first surface under pressure and is sucked away from said second surface and whereby said bath will flow through apertures defined in said article.

3. An electroless plating apparatus comprising:
(a) a tank in which an article to be electrolessly plated is supported such that said article is at least partially immersed in a constituent bath within said tank;
(b) means for creating a pressure difference within said bath comprising a plurality of delivery ports separated from a first surface of said article by a first preselected distance and a plurality of return ports separated from a second surface of said article by a second preselected distance, wherein said first and second surfaces are on opposite sides of said article, and wherein said bath impinges onto said first surface of said article and is sucked away from said second surface of said article; and
(c) means for periodically reversing the direction of said pressure difference created in said constituent bath, whereby said bath alternatively impinges on and is sucked away from said first surface and said second surface of said article, respectively; whereby said bath will flow through apertures defined in said article; and whereby said flow of said bath through said apertures defined in said article correspondingly reverses direction.

4. An electroless plating apparatus, comprising:
(a) a tank in which an article to be electrolessly plated is supported such that said article is at least partially immersed in a constituent bath within said tank;
(b) means for creating a pressure difference within said bath whereby said bath impinges onto a first surface of said article and is sucked away from a second surface of said article, wherein said means for creating a pressure difference comprises:
  (i) pumping means for delivering said bath under pressure through a plurality of delivery ports manifolded to said pumping means onto a first surface of said article, said delivery ports being a first preselected distance away from said article and distributed corresponding to the area to be electrolessly plated; and
  (ii) suction means for sucking said bath through a plurality of return ports manifolded to said suction means away from said second surface, said return ports being a second preselected distance away from said article and distributed corresponding to the area to be electrolessly plated; whereby said bath impinges onto said first surface under pressure and is sucked away from said second surface and whereby said bath will flow through apertures defined in said article; and
(c) means for causing relative motion between said article and said delivery ports and said return ports in a direction substantially perpendicular to the direction of said impinging bath.

5. An electroless plating apparatus comprising:
(a) a tank in which an article to be electrolessly plated is supported such that said article is at least partially immersed in a constituent bath within said tank;
(b) means for creating a pressure difference within said bath, wherein said bath impinges onto a first surface of said article and is sucked away from a second surface of said article opposite said first surface, wherein said means for creating a pressure difference comprises:
  (i) means a first preselected distance away from said first surface for directing said bath toward said first surface; and
  (ii) means a second preselected distance away from said second surface for drawing said bath away from said second surface, whereby said first and second surfaces are thoroughly subjected said constituent bath; and
(c) means for removing particulates from said bath.

6. An electroless plating apparatus comprising:
(a) a tank in which an article to be electrolessly plated in supported such that said article is at least partially immersed in a constituent bath within said tank;
(b) means for creating a pressure difference within said bath, wherein said bath impinges onto a first surface of said article and is sucked away from a second surface of said article opposite said first surface, wherein said means for creating a pressure difference comprises:
  (i) means a first preselected distance away from said first surface for directing said bath toward said first surface; and
  (ii) means a second preselected distance away from said second surface for drawing said bath away from said second surface, whereby said first and second surfaces are thoroughly subjected to said constituent bath; and
(c) means for introducing a gas into said bath contained in said tank.

7. The apparatus as claimed in claim 6 wherein said means for introducing said gas comprises an air pump interconnected to and in fluid communication with said tank for bubbling air through the constituent bath contained in said tank.

8. An electroless plating apparatus comprising:
(a) a tank;
(b) first and second facingly disposed manifolds, each said manifold having a plurality of apertures therethrough;
(c) at least one pump means interconnecting said first and second manifolds for pumping fluid from said first manifold to said second manifold; and
(d) means for supporting a substantially planar article having first and second planar opposing surfaces substantially parallel to and between said first and second manifolds, wherein there is a first preselected distance from said first manifold to said first surface, and a second preselected distance from said second manifold to said second surface; whereby a constituent bath contained in said tank in which said article is at least partially immersed impinges against said first planar surface of said article and is sucked away from said opposing second surface of said article, and whereby said bath will flow through apertures defined through said article.

9. An electroless plating apparatus as claimed in claim 8 further comprising switching means for periodically reversing the flow direction of said at least one pump such that the impingement and suction of said bath with respect to said article alternates periodically.

10. An electroless plating apparatus comprising:
(a) a tank;
(b) first and second facingly disposed manifolds, each said manifold having a plurality of apertures therethrough;

(c) at least one pump means interconnecting said first and second manifolds for pumping fluid from said first manifold to said second manifold;

(d) means for supporting a substantially planar article having first and second planar opposing surfaces substantially parallel to and between said first and second manifolds, wherein there is a first preselected distance from said first manifold to said first surface, and a second preselected distance from said second manifold to said second surface; and (e) means for oscillating said article along a line substantially parallel to said first and second manifolds; whereby a constituent bath contained in said tank in which said article is at least partially immersed impinges against the first planar surface of said article and is sucked away from the opposing second surface of said article, and whereby said bath will flow through apertures defined through said article.

11. The apparatus as claimed in claim 10 wherein said means for oscillating said article comprises a motor driven rocker arm mechanism linked to a bracket wherein said bracket moves back and forth along a track with each revolution of said motor.

12. An electroless plating apparatus as claimed in claim 8 wnerein said plurality of apertures defined through said inward facing surfaces of said first and second manifolds comprises a matrix of closely spaced holes.

13. An electroless plating apparatus as claimed in claim 8 wherein said at least one pump comprises a pair of oppositely directed centrifugal pumps each interconnected independently to said first manifold and said second manifold.

14. An electroless plating apparatus comprising:
(a) a tank;
(b) first and second facingly disposed manifolds, each said manifold having a plurality of apertures therethrough;
(c) at least one pump means interconnecting said first and second manifolds for pumping fluid from said first manifold to said second manifold;
(d) means for supporting a substantially planar article having first and second planar opposing surfaces substantially parallel to and between said first and second manifolds, wherein there is a first preselected distance from said first manifold to said first surface, and a second preselected distance from said second manifold to said second surface; whereby a constituent bath contained in said tank in which said article is at least partially immersed impinges against the first planar surface of said article and is sucked away from the opposing second surface of said article, and whereby said bath will flow through apertures defined through said article; and
(e) means for removing particulates from said bath comprising at least one filter disposed in at least one fluid line between said first and second manifolds.

15. An electroless plating apparatus comprising:
(a) a tank:
(b) first and second facingly disposed manifolds, each said manifold having a plurality of apertures therethrough;
(c) at least one pump means interconnecting said first and second manifolds for pumping fluid from said first manifold to said second manifold;

(d) means for supporting a substantially planar article having first and second planar opposing surfaces substantially parallel to and between said first and second manifolds, wherein there is a first preselected distance from said first manifold to said first surface, and a second preselected distance from said second manifold to said second surface; wherein said means for supporting said article comprises a substantially U-shaped bracket slidably mounted on a track on the floor of said tank, said article being receivable within said bracket, wherein said bracket can be slidably translated along said track; whereby a constituent bath contained in said tank in which said article is at least partially immersed impinges against the first planar surface of said article and is sucked away from the opposing second surface of said article, and whereby said bath will flow through apertures defined through said article.

16. An electroless plating apparatus comprising:
a tank;
first and second inwardly facing manifolds disposed at opposite ends of said tank, each manifold having a matrix of closely spaced holes defined through the inward facing surface thereof;
a pair of oppositely directed centrifugal pumps each independently interconnecting said first manifold and said second manifold;
means for supporting a substantially planar article between and substantially parallel to said first and second manifolds;
means for oscillating said article along a line substantially parallel to said first and second manifolds;
switching means for periodically reversing the flow direction of said pumps for periodically alternating the impingement and suction of said bath with respect to said article;
means for introducing a gas into said tank for bubbling said gas through said bath;
filtering means disposed in a fluid line interconnecting said first and second manifolds for removing particulates from said bath, whereby a uniform layer of electrolessly plated metal is deposited on selected portions of the surface of said article and along the walls of holes defined through the surface of said article.

17. A plating apparatus for treating an article with a constituent bath, comprising:
(a) a tank suitable for holding a constituent bath;
(b) support means operatively associated with said tank for supporting an article having at least one portion to be treated within said tank such that at least said one portion is immersed within said constituent bath, said one portion having first and second oppositely disposed surfaces;
(c) delivery means operatively connected with said tank separated from said first surface by a first preselected distance for directing said constituent bath onto said first surface of said one portion of said article to be treated; and
(d) return means operatively connected with said tank, oppositely disposed to said delivery means, and separated from said second surface by a second preselected distance for sucking said constituent bath away from said second surface.

18. Apparatus as recited in claim 17, further including means operatively connected with said tank for permitting said constituent bath to pass from said first surface to said second surface of said article when said article is operatively supported by said support means, without requiring said constituent bath to pass through said article; whereby the bulk chemical concentration of said bath is maintained on both sides of said immersed article.

19. Apparatus as recited in claim 17, wherein said tank is configured such that said constituent bath is exposed to normal atmospheric pressure; whereby said pressure difference within said bath is created only by the action of said delivery and said return means.

* * * * *